(12) United States Patent
Lundberg

(10) Patent No.: US 9,129,929 B2
(45) Date of Patent: Sep. 8, 2015

(54) THERMAL PACKAGE WITH HEAT SLUG FOR DIE STACKS

(71) Applicant: Sony Mobile Communications AB, Lund (SE)

(72) Inventor: Nils Lundberg, Hollviken (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 3 days.

(21) Appl. No.: 13/860,705

(22) Filed: Apr. 11, 2013

(65) Prior Publication Data

US 2013/0277821 A1    Oct. 24, 2013

Related U.S. Application Data

(60) Provisional application No. 61/635,376, filed on Apr. 19, 2012.

(30) Foreign Application Priority Data

May 30, 2012   (EP) ..................... 12170009

(51) Int. Cl.
*H01L 23/34* (2006.01)
*H01L 23/02* (2006.01)
*H01L 23/48* (2006.01)
(Continued)

(52) U.S. Cl.
CPC ............. *H01L 23/34* (2013.01); *H01L 23/36* (2013.01); *H01L 23/3677* (2013.01); *H01L 23/3735* (2013.01); *H01L 23/4334* (2013.01); *H01L 25/0657* (2013.01); *H01L 2224/16225* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06565* (2013.01);
(Continued)

(58) Field of Classification Search
CPC .............. H01L 25/0657; H01L 23/473; H01L 23/5226; H01L 23/4334; H01L 2224/16; H01L 2224/14; H01L 2224/48091; H01L 2924/01079; H01L 2924/01013; H01L 2224/73253; H01L 2224/48247; H01L 2924/01078
USPC ......... 257/713, 685, 686, 723, 777, 778, 774, 257/786, 787, 796, 675
See application file for complete search history.

(56) References Cited

U.S. PATENT DOCUMENTS

2008/0083975 A1    4/2008   Chao et al.
2009/0168367 A1*   7/2009   Fujii ............................ 361/720
2011/0018119 A1    1/2011   Kim et al.

FOREIGN PATENT DOCUMENTS

JP    2009 164152 A    7/2009
KR    2011 0044964 A   5/2011

OTHER PUBLICATIONS

European Search Report, dated May 6, 2013, corresponding to EP 12 17 0009.

*Primary Examiner* — A. Sefer
*Assistant Examiner* — Dilinh Nguyen
(74) *Attorney, Agent, or Firm* — Renner, Otto, Boisselle & Sklar LLP

(57) ABSTRACT

A semiconductor assembly comprises a package, which in turn comprises at least one substrate, a first die stacked onto the substrate, at least one further die stacked onto the first die, at least one heat spreader in the package, and TSV:s extending through the stacked dies. The ends of the TSV:s are exposed at the further die.

26 Claims, 5 Drawing Sheets

(51) Int. Cl.
*H01L 23/52* (2006.01)
*H01L 29/40* (2006.01)
*H01L 23/28* (2006.01)
*H01L 23/36* (2006.01)
*H01L 23/367* (2006.01)
*H01L 23/373* (2006.01)
*H01L 23/433* (2006.01)
*H01L 25/065* (2006.01)

(52) U.S. Cl.
CPC ............... *H01L2225/06589* (2013.01); *H01L 2924/15311* (2013.01)

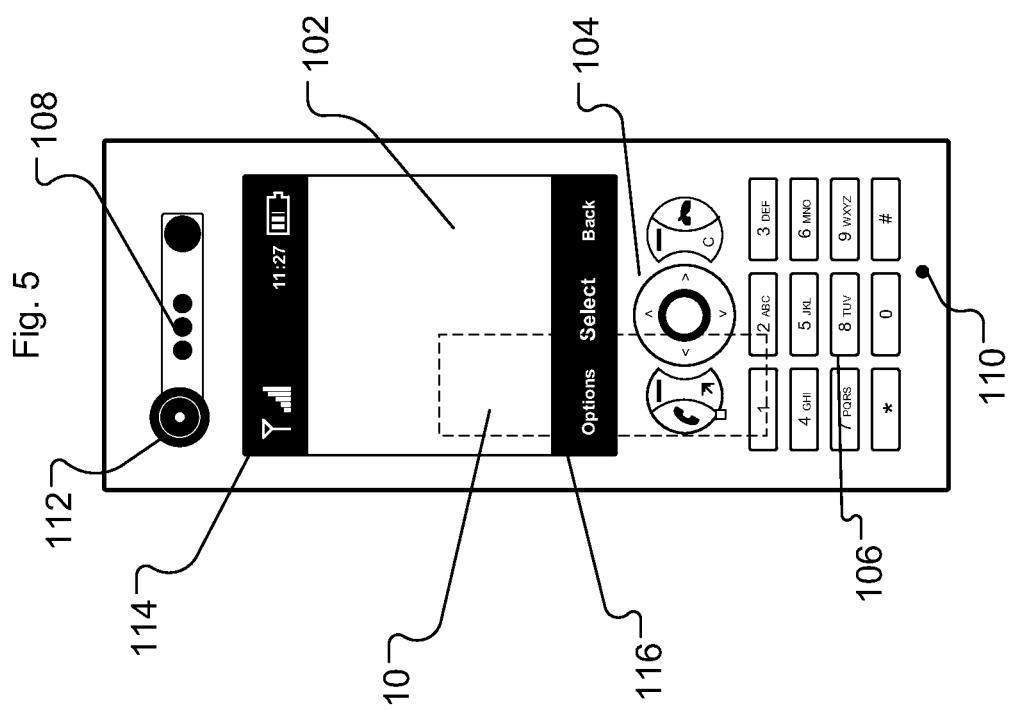

THERMAL PACKAGE WITH HEAT SLUG FOR DIE STACKS

CROSS-REFERENCE TO RELATED APPLICATION

This application claims the benefit of U.S. Provisional Patent Application Ser. No. 61/635,376, filed Apr. 19, 2012, the entire disclosure of which is hereby incorporated by reference.

The present invention relates to integrated circuits and associated electronics, and particularly to heat dissipation features of vertically stacked dies in packages and other printed board assemblies.

BACKGROUND ART

In three dimensional packaging, connected integrated circuits are made more compact by vertically stacking two or more dies with a high speed and substantially direct interface. The main reason for vertically stacking dies is better signal performance, i.e. stacked dies are less parasitic as wire length is reduced. Micro ball connections that may be used with vertical die stacks instead of relatively long leads on the periphery of the chips may reduce elapsed time for communication of signals between components, thus increasing speed as wire lengths both between dies in a system and between the circuit and the circuit board may be shortened. In the case of CPU and dynamic random access memory (DRAM) dies, this effect is manifested in higher bandwidth such that there is faster communication between the CPU and DRAM dies. As a secondary reason for vertically stacking dies, vertical die stacks are desirable to reduce the footprint and overall size of the integrated circuits. However, upper or outer vertical dies impede dissipation of heat from lower or inner dies or other components and prevalently increasing processor speeds may generate more heat than previous processors. At the same time, the sizes of dies in general have been reduced, which reduces the surface area available for dissipating heat. One way of operatively interconnecting dies in a die stack is to use through silicon vias (TSV) and silicon-silicon interconnections (SSI).

Accordingly, there is concern with respect to thermal impact and generation of excessive heat in die stacking and in printed board assemblies.

For the foregoing reasons, there is a need for heat to be dissipated from die stacks in packages and other printed board assemblies.

SUMMARY OF THE INVENTION

It is an object of the invention to provide a semiconductor assembly, which solve, or at least mitigate, the problems with the heat impact in die stacking mentioned above.

Another object of the invention is to provide a semiconductor assembly that reduces the effect of excessive heat generation in active portions of dies by improved heat dissipation enabling dimensions of dies to be maintained or even reduced for less footprint area without increased heat impact and negative effects associated therewith.

Yet another object of the invention is to provide a semiconductor assembly that reduces the negative effects of its own heat generation compared to conventional die stacks as an increased heat generation and negative effects associated therewith does not have to be compensated for by "driving"/operating the co-operating active portions of the individual dies with lower performance similar to "dimming" down electric lights to save energy as in prior art die stacks, whereby better performance of the integrated circuits is achieved by the inventive semiconductor assembly having an optimized heat dissipation ability, i.e. a transient solution, and heat buffering, i.e. a sustainable solution, compared to known semiconductor assemblies.

These objects are achieved by means of a semiconductor assembly, as claimed in the associated independent claim, preferred variants thereof being defined in the associated dependent claims.

The semiconductor assembly according to the independent semiconductor assembly claim makes it possible to increase heat dissipation from the active portions of dies in a die stack while maintaining or even reducing the outer dimensions of the whole semiconductor assembly enabling assembly of the inventive semiconductor assembly on an old printed circuit/wiring board.

The semiconductor assembly according to the independent semiconductor assembly claim also makes it possible to increase the performance of the active portions of the dies while maintaining the dimensions of most of the components of the whole semiconductor assembly, wherefore at least the height of the semiconductor assembly is not increased to the same extent as would be the case if the semiconductor assembly was only enlarged in the conventional way by using external means for heat dissipation.

The semiconductor assembly according to the independent semiconductor assembly claim makes it possible to improve heat dissipation and heat buffering by using inherent parts of the semiconductor assembly for increasing heat transport from heat generating portions through the package to the heat spreader and via the heat spreader down through the dies into the printed circuit/wiring board working as an additional heat spreader while minimizing the footprint area of the whole package as the heat transporting parts are located within this area.

The semiconductor assembly according to the independent semiconductor assembly claim makes it possible to improve heat dissipation and heat buffering by using inherent parts of the semiconductor assembly for increasing heat transport from heat generating portions, wherefore the excessive heat in so called "hot spots" of the package design is reduced. Hence, the high excessive heat in the central area of the package, if the active die portions are located closer to the center of the package, or too high excessive heat generated more evenly over the whole footprint area of the package when the heat generating active die portions are more evenly spread over the whole footprint area of the package is more effectively and faster transported there from reducing negative impacts of excessive heat in an improved way.

It is an object of the invention to provide a semiconductor assembly which comprises a package which, in turn, comprises at least one substrate, a first die stacked onto the substrate, at least one further die stacked onto the first die, at least one heat spreader in the package, and TSV:s protruding/extending through the stacked dies, such that ends of the TSV:s are exposed at the further die, wherein the exposed ends of the TSV:s are in thermal contact with the heat spreader. The effect of this is that when there are one or more dies stacked on the substrate, the heat spreader is in thermal connection with the TSV:s, thus allowing for heat dissipation vertically through the TSV:s to the heat spreader. The ends of the TSV:s are protruding from the last/outmost die in the stack so that they are in thermal contact with the heat spreader and so that they can be soldered or in other ways be connected to the heat spreader. All the passive silicon, e.g. passive portion of each die, is in good thermal contact with the heat spreader.

Good thermal contact may be achieved by means of thermal grease interposed between passive portions of dies and the heat spreader.

According to another aspect of the invention, the heat spreader is thermally connected to at least one TMV being thermally connected through conducts through the substrate and down to PWB via, for example solder joints, for heat dissipation by means of the PWB acting as an additional heat spreader. An advantage of this is that the heat from the die stack can dissipate from the heat spreader to TMV:s and further to the PWB via conducts in the substrate and solder joints connecting the substrate to the PWB, thus improving the heat dissipation and increasing the cooling of the semiconductor assembly.

According to a further aspect of the invention, the TMV:s, connected through conducts to the PWB via solder balls for heat dissipation from the heat spreader, is thermally connected at the edges of the heat spreader. The effect of this is that the heat is dissipated from the edges of the heat spreader to the TMV:s.

According to yet another aspect of the invention, the heat spreader at least covers all of the exposed TSV ends to make it possible for heat dissipation from all of the TSV:s to the heat spreader.

According to yet a further aspect of the invention, the heat spreader covers substantially the whole area of the die stack. The bigger the heat spreader is, the better it is at dissipating heat; a bigger heat spreader means faster heat dissipation from the TSV:s.

According to yet a further aspect of the invention, the heat spreader extends over substantially the whole area of the substrate. If the heat spreader is big, more heat dissipates faster but it cannot be too big since then it affects the footprint of the semiconductor assembly on the PWB.

According to yet a further aspect of the invention, the TMV is arranged along the edges of a capsule about the whole die stack. If the TMV or a plurality of TMV:s is/are arranged over a larger area, i.e. along the periphery of the whole die stack as in this aspect, more heat dissipates faster but the area cannot be too big since then it affects the footprint of the semiconductor assembly on the PWB.

According to another aspect of the invention, the heat spreader has at least three corners. This gives an easier assembly of the heat spreader when plate shaped onto/into the dies/the package, if the heat spreader has a rounded plate shape, it has no corners.

According to yet another aspect of the invention, the TMV:s, connected through conducts through the substrate and down to PWB for heat dissipation from the heat spreader is thermally connected at the corner areas of the heat spreader. This is to optimize where the TMV:s are connected in terms of how fast the heat dissipates and also structurally; it is easy to assemble the semiconductor assembly when the conducts and TMV:s are located in the corner area of the device.

According to a further aspect of the invention, the TSV ends are soldered to the heat spreader. This makes sure that the heat spreader stays in place on the die stack and makes sure that there is a good thermal contact between the TSV:s and the heat spreader.

According to yet a further aspect of the invention, the package substrate comprises thermal connectors connecting the TMV to the PWB, which thermal substrate connectors/connections are wider than electrical connections of the substrate. Since heat dissipates faster through a wider connector/connection it is preferred to have them, at least, wider than the electrical connections.

According to another aspect of the invention, the top most die in the die stack has its exposed ends of its TSV:s in thermal contact with the heat spreader. The effect of this is that it is the last or outmost die in the stack that has its TSV:s in thermal contact with the heat spreader improving heat dissipation and thermal connection to the heat spreader.

According to yet another aspect of the invention, each TMV is linearly aligned with a corresponding conduct connected via solder joints to the PWB. The TMV:s:s are linearly aligned because it makes the semiconductor package easier to manufacture, e.g. when placing the dies on each other and when soldering the connections between the dies but also between the dies and the PWB. So from a structural design point of view it is easier to manufacture the device if the TSV:s, the TMV:s, the conducts and the solder balls are linearly aligned. Moreover, with TMV:s placed in direct alignment with thermal conducts/connections and/or connectors, in package substrate and solder joints to PWB, an optimal dissipating heat transfer away from heat spreader and package to the PWB, is obtained.

In some embodiments/aspects, the TSV:s extend from the "hot spots" of the package to the heat spreader and joins the heat spreader by means of a transition section forming a thermal connection at each TSV end and the heat spreader forms a heat buffer and heat conductor thermally connected at its outer perimeter to through-mold-vias (TMV:s) extending down to the PWB through stacked vias in package substrate, which act as thermal connectors in the substrate, to/via corner solder balls from the package to the PWB and through thermal conducts/connectors (i.e. stacked vias) in the PWB into the ground layer of the PWB (may be ground layers in the centre of the PWB) for lateral heat spread. Similarly, the ability to withstand an increased heat generation is improved further, since the TSV:s, TMV:s, heat spreader and thermal conducts and connectors "smears out" the excessive heat faster and increases the volume/thickness of the heat flow paths in the package and the PWB between the heat generating active portions of the dies and the ground layer of the PWB such that the negative impacts of the excessive heat is reduced due to both a faster heat flow/dissipation response time and transient heat peaks, also reducing negative impacts of excessive heat in sustainable situations.

BRIEF DESCRIPTION OF THE DRAWINGS

The invention will be described in more detail with reference to the appended drawings, which show examples of presently preferred embodiments of the invention.

FIG. 5 is a front view of a mobile device comprising a semiconductor assembly as shown in any one of FIGS. 1-4.

DETAILED DESCRIPTION OF THE INVENTION

Figure 1:
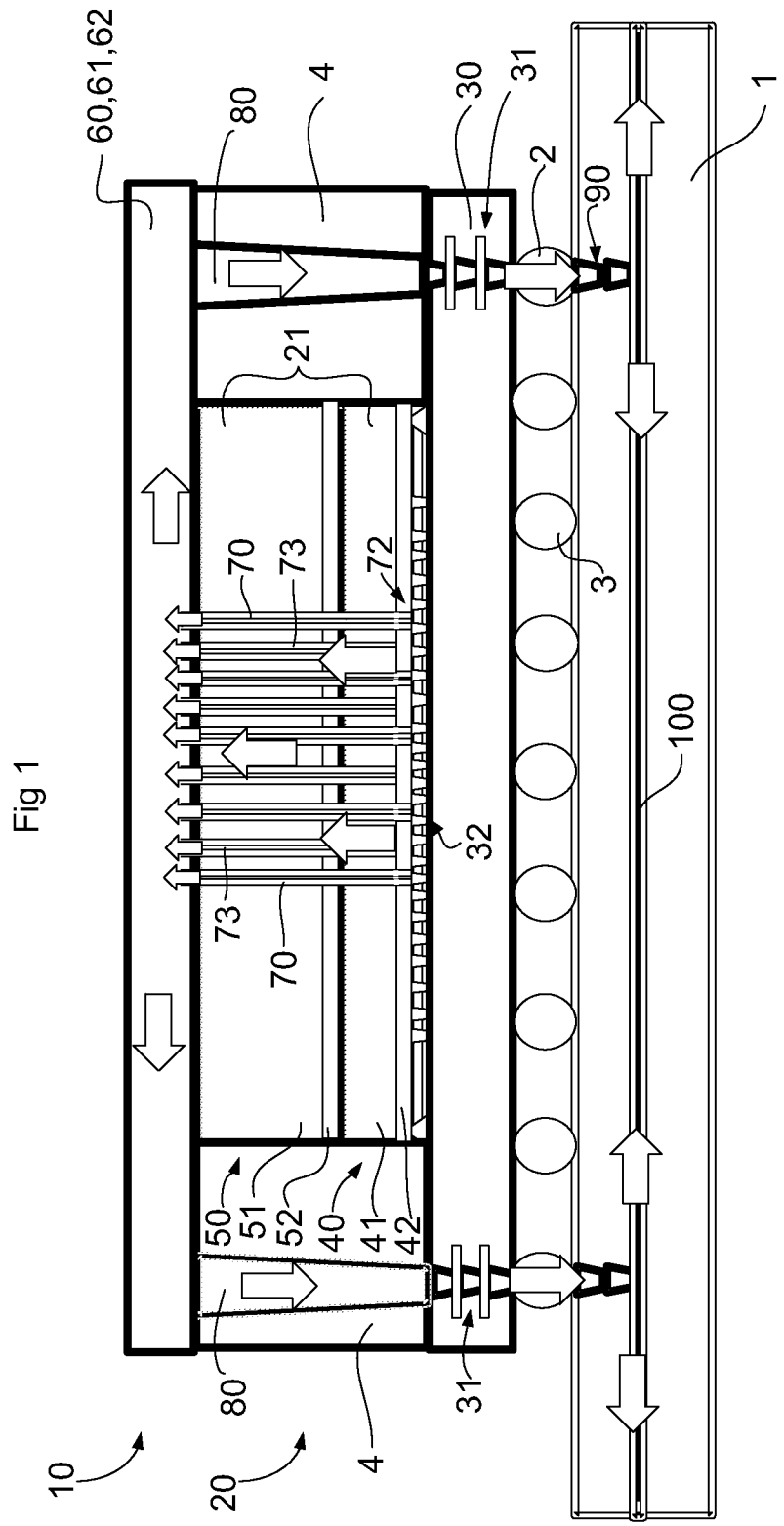
FIG. 1 shows a cross section of a semiconductor assembly, where the arrows indicate the dissipated heat path.

A semiconductor assembly 10 according to the invention is shown in FIGS. 1 to 4, wherein like reference numerals designate corresponding or similar elements throughout the views, a first embodiment of a semiconductor assembly 10 is shown in FIG. 1. A package 20 comprising a die stack 21 is included in the semiconductor assembly 10 and may have a die-die connection using a Micro Pillar Grid Array (MPGA)

in the package. The die stack 21 comprising dies 40, 50, the package 20 and a printed circuit/wiring board 1 are operatively connected in a known way by solder joints 2, which connections will not be explained in detail as the skilled person is aware of this technique.

The die stack 21 includes a first die/an lower die 40, at least one further/second/upper die 50, and a package substrate 30. The dies disclosed herein are semiconductors that may have passive portions 41, 51, active portions 42, 52 or any combination or number of such portions depending on the desired function and application of the dies and the package. The dies are connected back-to-front, i.e. the backside of the at least one first/lower die is connected to the front side of the second/upper die. Solder balls 3 are shown for connection of the PWB 1 to the bottom of the package substrate 30.

Figure 2:
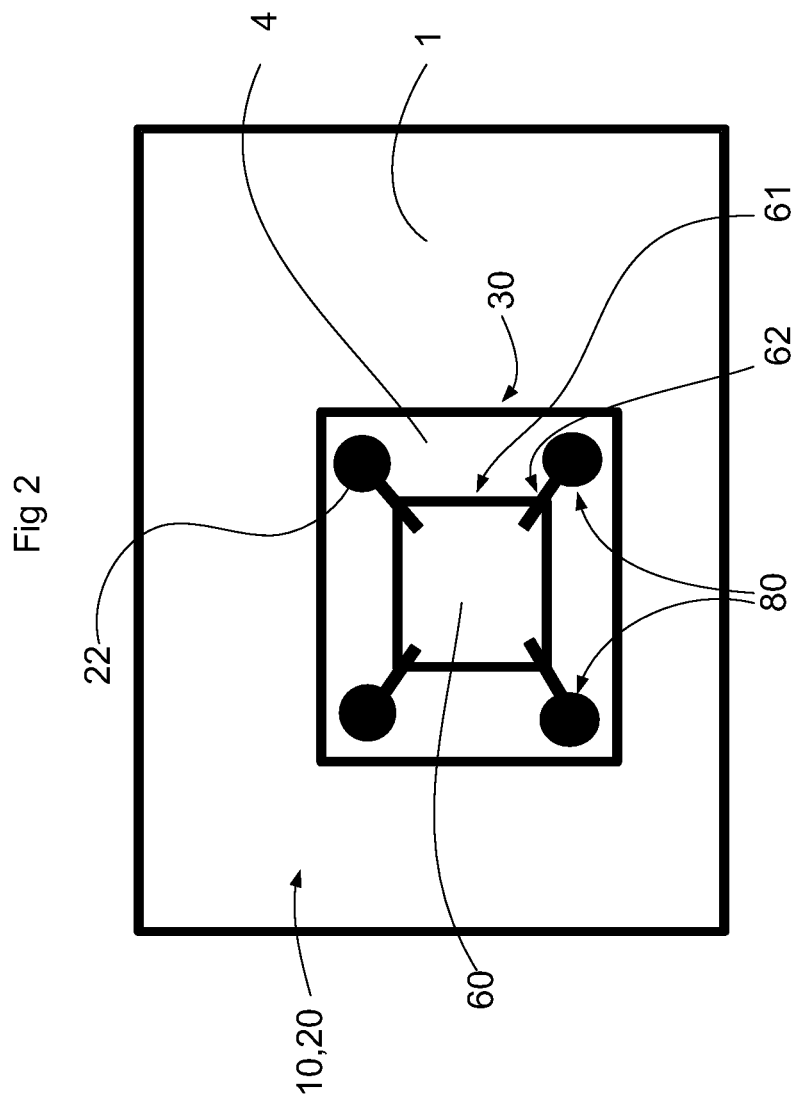
FIG. 2 shows an embodiment from the top where a heat spreader is connected to corner pads via wire bonds.
Figure 3:
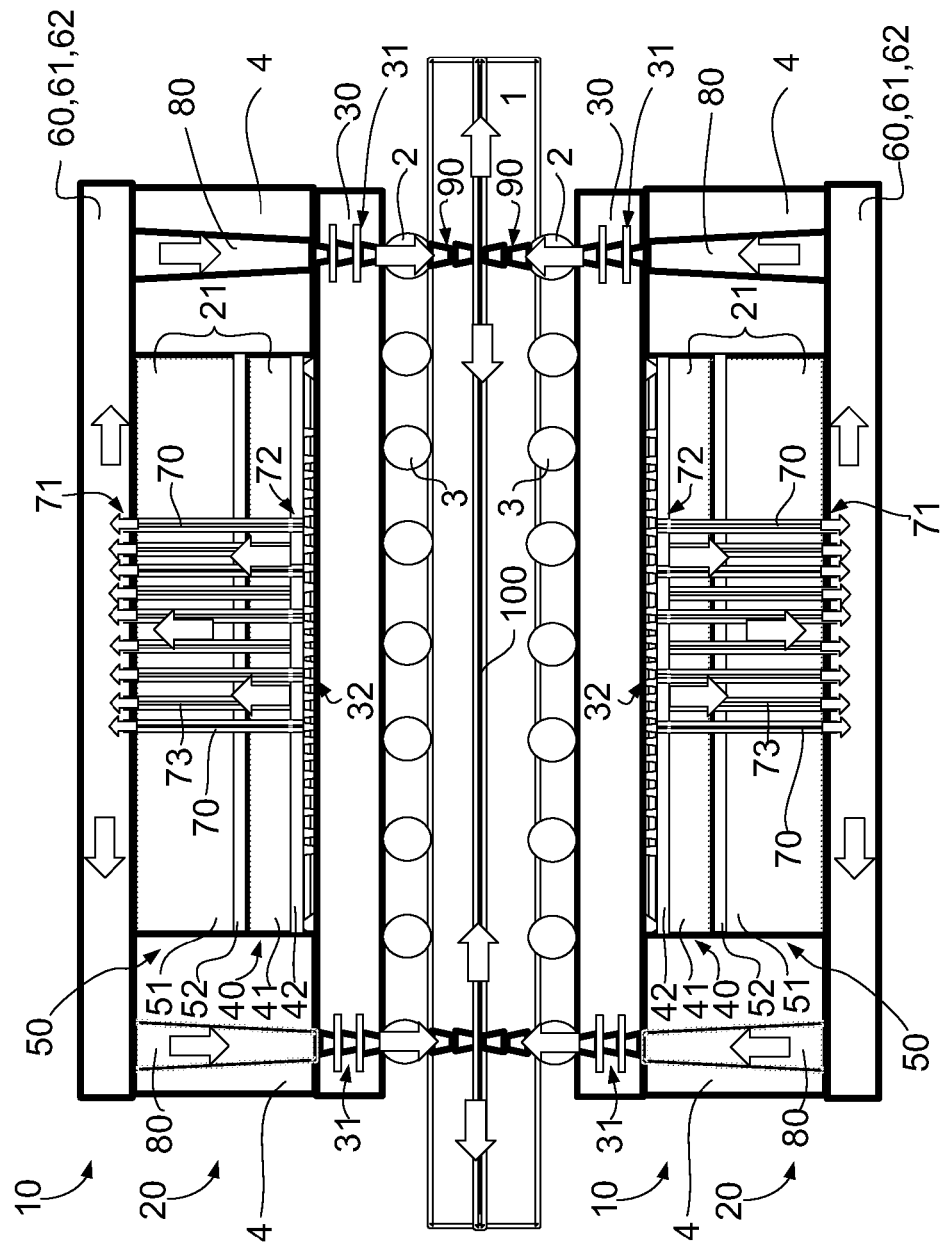
FIG. 3 is an embodiment where there is a package both on top and below/under a PWB.

In FIG. 3, a corresponding further semiconductor assembly 10/second package 200 is shown below the PWB 1 and the first semiconductor assembly 10/first package 20 being placed above the PWB as shown in FIGS. 1-3. Here, the upside-down second semiconductor assembly 10 may be identical with the first semiconductor assembly or the second semiconductor assembly 10 may at least comprise one different component compared to the first semiconductor assembly. However, the main purpose of FIG. 3 is to show that a corresponding second semiconductor assembly 10 may be operatively connected in the same way but below the PWB as a mirrored version and for the same reason as the first semiconductor assembly 10/first package 20 to the PWB as at least one further complementing second semiconductor assembly 10/second package 200 or even more assemblies.

In FIGS. 1-3, the upper die 50 has an active portion 52 including an active surface proximate to and mounted to the package substrate 30, by means of for example copper (Cu) pillars 32. A passive portion 51 of the upper die 50 is on top of the active portion 52. The upper die 50 may be mounted to the lower die 40 with the active portion 42 of the lower die 40 proximate to the passive portion 51 of the upper die 50, using electrical connectors/conducts 32 in a known way, e.g. micro bumps. Such micro bumps 32 are connection material that may include a Cu post and a tin (Sn) cap (not shown).

The passive portion 41 of the lower die 40 is above the active portion 42. Additional mechanical or soldered connections with micro balls may be provided as known by the skilled person.

Passing through the entire thicknesses of each of the dies 40, 50 or more dies are Through-Silicon Vias (TSVs) 70, which are passages completely through the dies 40, 50. TSVs eliminate the edge wiring between dies, which generally is placed on the periphery of the dies, potentially reducing wire length, with the TSV allowing vertical connections through the body of the dies and resulting in less signal parasitic and a smaller footprint, and no intermediate separating layer is required between dies. Because dies may be manufactured with materials other than silicon, a TSV may also be considered herein a through-semiconductor via. Two types of TSVs may be used in the semiconductor assemblies 10. The first type of TSV 70 according to the invention with ends 71 enables heat conduction/thermal dissipation, of which nine are shown in each die 40, 50 in FIGS. 1-4. The second type of TSV:s (not shown) is used for data bus signals, power, and ground, i.e. electrical TSV:s operatively connected in a known way to the package substrate. The thermal or first type of TSVs 70 in the upper die 50 have exposed ends 71 adapted to face and thermally contact a heat spreader 60 above the upper die. The thermal TSVs 70 in the upper die 50 are aligned with thermal TSV:s in the lower die 40 referred to herein as deep wells 73, which extend from the upper side of the active portion 52 of each upper die 50, for example, from within a few microns of the activated die material, to the upper side of each upper die 50. The nine deep wells 73 shown are configured to provide thermal dissipation from the active portion 52 of each lower die 40 via micro bumps to the other ends 72 of the thermal TSV:s 70 of the upper die 50. The TSVs 70 of the lower die are connected to the TSVs 73 or deep wells, as applicable, of the upper die 50 utilizing Cu—Sn micro bumps 32. TSVs 70 extend through the semiconductor assembly 10 completely through the dies 40, 50 from the package substrate 30 and the deep wells 73 do not extend completely through the dies and do not extend from the package substrate.

The TSV:s 70 passing completely through the dies 40, 50 eliminate the edge wiring between dies, which generally is placed on the periphery of the dies, potentially reducing wire length, with the TSV allowing vertical connections through the body of the dies and resulting in less signal parasitic and a smaller footprint, and no intermediate separating layer is required between dies. An epoxy-based underfill may be used between the dies in the die stack for increased mechanical stability. Dies may be manufactured with materials other than silicon.

In this semiconductor assembly 10 embodiment, the TSVs 70 for thermal dissipation and the deep wells 73 and also the openings for the purpose of heat dissipation, are relatively wide as compared to TSVs for data bus signals, power, and ground. The TSV s 70 and deep wells 73 are filled, after first being metal coated, with a relatively high heat conductivity material that has a higher heat conductivity than the die material or the metal coating. Such materials include, but are not limited to copper, tungsten, silicon carbide (SiC), diamond, or carbon nanotube (CNT). The deep wells start at or proximate to the active Si layer (i.e. a few microns away from processed layers of silicon) and extends to the backside of the die. The material filling the TSVs 70 include ends 71 or protruding extensions above the upper die 50 which further enhance conduction of heat from the TSV:s 70, 73 by providing surface area outside of the outmost die 50.

The diameter of a TSV 70 is typically from 1 to 30 μm. A deep well 73 may have a diameter ranging from approximately 10 to 100 μm. With respect to deep wells and TSV:s, a wider flow path for heat is superior for dissipation, so the dimensions of the flow path may be set by a skilled person depending on the severity of the local hot spot, or area where the greatest amount of heat is generated and/or accumulated as particular to a given die. Such a position may be, for example, where there is a relatively high degree of electrical activity. The position of a hot spot on a die could be calculated in advance or iterated for a specific package. The cross-sectional shape of the TSV:s 70 and deep wells 73 may be circular or otherwise, and may, for example, take the shape of the applicable hot spot. Processed very-large-scale integration (VLSI) silicon is paid for by surface area, so a larger diameter deep well will be more expensive if it blocks other functionality in the area. Therefore, for cost reasons, deep wells may be designed just to "do the job," and not be any larger than necessary.

A mold/capsule 4 completes the embodiment of package 20, 200. Molds in general may be made of epoxy and ceramic fillers. An example of a ceramic that may be used is aluminum oxide. The mold 4 of the package 20, 200 may have a high heat conductivity filler material added to the epoxy, which increases the heat conductivity of the mold 4, which may be SiC or diamond which conducts heat but not electricity. Alternatively, the mold 4 could be omitted at least over the heat spreader 60 to have at least a part of the upper surface of the heat spreader bare in the die stack 21. In this case, the ends 71 of the material filling the TSV:s 70 would extend outward into the environment before thermal connection to the heat spreader 60, which heat spreader after interconnection to these ends 71 would be the outmost placed part at least partly exposed to the surrounding environment. In other aspects, also mold 4 could be arranged at least partly between die stack and heat spreader for at least partly protecting the semiconductor assembly as long as the TSV:s 70 and any through-mold-vias (TMV:s) 80 used for heat transfer are in thermal connection with the heat spreader 60, i.e. good thermal contact for example by use of thermal grease, e.g. between the passive silicon and the heat spreader, facilitating the thermal contact.

The dies 40, 50 of the semiconductor assembly 10 and the others described herein may be made based on silicon (Si) and variants thereof. In some cases for example germanium (Ge) or Ge and carbon are added to Si to increase charge carrier mobility. Alternative materials may include but not be limited to gallium arsenide (GaAs), indium phosphide (InP), graphene, or other III-IV semiconductor compounds. Further, although Through-Silicon Vias are referred to herein as TSV:s because of the prevalence of the use of silicon, in light of the fact that other materials may be used for the die, the term TSV is understood to apply to a like passage regardless of the die material In the embodiment shown in FIGS. 1-4, the upper die 50 may be, for example, a DRAM, and the lower die 40 may be a CPU die. However, various components may be used in such an arrangement, including but not limited to stacking of processor blocks. In a second embodiment of a semiconductor assembly 10 shown in FIG. 4, a package 200 includes a die stack of four DRAM dies 210 joined using MPGA:s (not shown), which is a discrete and generally independently tested component known as a memory cube 201 that replaces the single upper die 50 of FIGS. 1-3, when that die 50 is a DRAM. FIG. 1 shows only a cross-section disclosing TMV:s on each side of the die stack 21 evenly placed along package perimeter surrounding the die stack.

Figure 4:
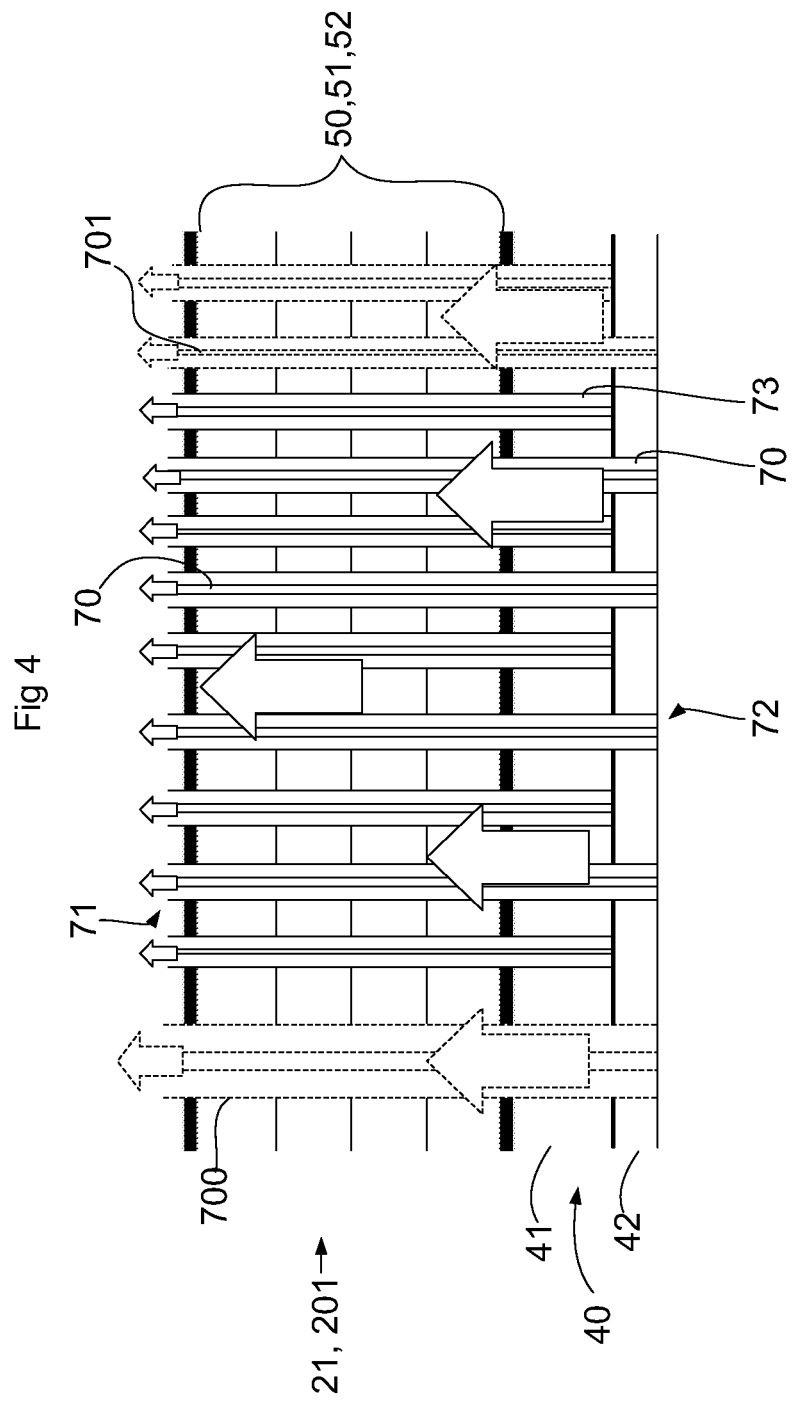
FIG. 4 is a zoomed in view of the TSV:s and the die stack.

The memory cube 201 as shown in FIG. 4 comprises four DRAM dies 210 and nine relatively narrow TSV:s 70 shown with solid lines and one relatively wide TSV:s 700 shown to the left in FIG. 4 with dotted lines and two further relatively thin TSV:s 701 shown to the right in FIG. 4 with dotted lines. Each DRAM die 210 has an active portion 42, 52 and a passive portion 41, 51, similar to the dies 40, 50. Connections between the TSV:s 70, 72 at the active portion 42, 52 of one DRAM die 210 and the TSV:s 70, 700, 701 of the adjacent DRAM die 210 beneath may also be made with Cu/Sn micro bumps 32. FIG. 4 shows that TSV:s with different thicknesses can be used and that different numbers of TSV:s can be used and also that TSV:s may be placed as a cluster at the center of the package as TSV:s 70 and/or be more evenly spread over the whole footprint area of the package as a combination of only TSV:s 70 in the middle and the TSV:s 701 to the right in FIG. 4 or as a combination of only the centre TSV:s 70 and the wide TSV 700 to the left in FIG. 4 or be a combination of all these TSV:s, e.g. with also one or more wider TSV:s 700 in the middle area and/or to the left in FIG. 4 where the TSV:s 701 are located.

Another embodiment of a semiconductor assembly may feature a DRAM package, a CPU die, and a rigid interposer Printed Wiring Board (PWB), such as a Mother-PWB. The PWB may include seven Through Hole Vias (THV s) for conducting heat. THV:s are conventionally filled with Cu. Like the previously described thermal TSV:s 70, 700, 701 and deep wells 73, THV:s are filled, after first being metal coated, with a relatively high heat conductivity material that has a higher heat conductivity than the PWB material or the metal coating. Such materials include, but are not limited to, silicon carbide (SiC), diamond, or carbon nanotube (CNT). The PWB may also include core layers, which in some cases may be Ground (GWD) layers 100 with slightly thicker Cu layers then in other parts of the PWB, and may therefore assist in heat dissipation as a heat sink. However, such a heat sink alone may be inadequate for the performance requirements of some semiconductor assemblies. This DRAM package may include a DRAM die having an active portion and a passive portion. The die is overmolded with a mold 4 including highly heat conductive filler, as previously described. CPU die also has an active portion and a passive portion, and as an alternative to the configuration shown, could be inside a package molding. The hot spots may in this example be substantially central to the active portion and have influenced the placement of the wide TSV:s 70, 700, 701 through the dies.

In the semiconductor assembly 10 of FIGS. 1-4, TSV:s 70, 73, 700, 701 are used for heat transfer. However, there are also through-mold-vias (TMV:s) 80 used for heat transfer from corner pads 22 on each package 20, 200 to the TMV:s, which TMV:s are aligned with the thermal connectors 31 of the package substrate 30, solder joints 2, 3 between package and PWB and stacked vias, e.g. thermal conducts or connectors 90 in the PWB 1. Accordingly, heat may flow (see arrows in FIGS. 1-4) from each active portion 42, 52 of the dies 40, 50 upwards in FIGS. 1 and 4 for package 20 and/or downwards in FIG. 3 for package 200 through the TSVs 70, 73 from the active portions 42, 52 of each die at the hot spots through the passive portions 41, 51 of each die 40, 50 to the ends 71 of the TSV:s and to respective heat spreader 60 (one placed above the PWB in FIG. 1 in package 20 and another heat spreader placed below the PWB in package 200 in FIG. 3), i.e. upward in FIGS. 1 and 4 and/or downward to the lower heat spreader 60 in FIG. 3, and via each heat spreader to each TMV 80 and via each TMV downward in FIG. 1 and/or upward in FIG. 3 via solder joints/balls between each package 20, 200 and the PWB 1 to the thermal conducts/connectors 90 of the PWB 1 and further into the ground layer 100 of the PWB for lateral spread there through. In some cases, e.g. a sustainable situation, heat is transferred through the heat spreader 60, the TMV:s 80 in the mold 4, the Cu/Sn micro bumps 32, and then to the mold 4 from which the heat may dissipate to the environment. The diameter of the TMV:s 80 may be, for example, approximately 200 to 600 μm if laser drilled or casted/molded in 100 to 300 μm thick mold 4. Moreover, as shown in FIGS. 1 and 3, the TMV:s 80 are wider than the TSV:s 70, 700, 701 shown in FIG. 4 achieving a very fast heat transfer and heat flow response time as the thickness of the TMV is large. Each TMV 80 may have a circular cross-section and a constant diameter but may in other cases as shown have a varying thickness being larger at the heat spreader than at the laminate substrate 30. Each TMV 80 may also improve the heat buffering as the TMV:s are relatively large with a relatively large volume. Each TMV 80 and each heat spreader 60 are preferably also made of a solid material being the same or similar material with corresponding characteristics as in the TSV:s 70, 700, 701. A TMV is, in one embodiment, cone shaped with a diameter of 560 μm at one/the upper end and 250 μm at the other/lower end.

Each heat spreader 60 is preferably as large as possible, e.g. at least as large as the laminate substrate 30 but preferably always larger than each die 40, 50. Each heat spreader 60 comprises edges 61 and corner areas 62 at the corner pads 22 of each package 20, 200.

The TSV:s 70, 700, 701 and TMV:s 80 and stacked vias in package substrate acting as thermal connectors 31 and 90 are preferably wider than the electrical connections to the substrate 30 in order to dissipate as much heat as possible.

The inventive semiconductor assembly 10 comprising at least one die stack 21 with at least one heat spreader 60 might have the heat spreader in thermal contact to shield can(s) and/or phone enclosure, see FIG. 5 and associated explanation of the shown parts in FIG. 5 below, to dissipate heat from the heat spreader to the shield can(s) and/or phone housing.

In one aspect, the die stack 21 may have at least one heat spreader 60 covered in mold 4 for full encapsulating of all the components/parts making up the semiconductor assembly or at least one heat spreader partly covered in mold 4, e.g. a thin mold between the lower surface of the heat spreader facing the outmost die 50 but leaving areas of the underside of the heat spreader exposed for good thermal connection to the ends 71 of each TSV 70. The dies shown herein are exemplary and are schematically depicted for the purposes of explanation. Accordingly, proportions, dimensions and numbers of components, TSV:s, TMV:s, deep wells, micro bumps, pillars and other features may and are expected to vary from those shown in the figures. The MPGA:s shown are representative of those described in JEDEC (Solid State Technology Association) draft Publication 95 Design Guide 4 xx for Micro Pillar Grid Arrays (MPGA) (July I 20 II). Wide I/O is made up of four channels of, for example, 128 bits each. For each individual channel there is a matrix of 6×50 micro bumps with 40/50 µm pitch (vertical/horizontal). Vertical spacing between two channels is equal to two rows. Horizontal spacing between two channels is equal to six columns. Each array makes up a data channel from DRAM to a CPU or from DRAM to the next DRAM.

Silicon die thickness ranges typically from 700 micrometer down to 70 micrometer thickness depending on how much back grinding has been carried out. TSV-containing wafers are generally back grinded to less than 500 µm to get the aspect ratio in a working range, as known by a skilled person. As referred to herein, the term "electronic component" refers to dies, packages, PWB:s, or the like.

The TSV:s, deep wells, and TMV:s, which may be filled with relatively highly heat conductive material, may be aligned to provide a flow path for heat conduction that may create a chimney effect, enhancing heat transfer. Where a mold is present, the highly heat conductive filler in the mold also may enhance heat transfer from the mold to the environment. With respect to the locations available for heat pathways, conventionally, TSV:s are placed near or at the center of the die but could be placed differently, e.g. more evenly spreaded over the footprint area. The MPGA that provides the footprint for joining to TSV dies is approximately only 5 mm², so the TSV:s can be located in many places; in general the TSVs can be located on any location of the die. Deep wells may be located any place on a die where heat needs to be removed. THV:s may be located anywhere on the PWB. A typical Smartphone board, for example, may already contain hundreds of drilled vias, and the addition of a limited number to dissipate heat may be considered generally inconsequential.

TSV:s and deep wells may be wet etched during Si fabrication. TMV:s are laser drilled in packages, generally at the facility where the packages is manufactured. THV (Through Hole Via), i.e. holes through the PWB are mechanically drilled. All holes may be coated with Cu, and in conventional products may be filled with either Cu, tungsten (W), or the like. THV:s are typically filled with Cu by means of electrical plating (in a wet process) in PWB factories. TSV:s are generally filled with such materials by means of chemical vapor deposition (CVD). CVD can also be used for the high heat conductivity fill materials disclosed herein, namely diamond, silicon carbide (SiC), and carbon nanotubes (CNT).

An embodiment of a mobile terminal, in this case a Smartphone, is shown in FIG. 5 and is generally designated at 100. FIG. 5 shows a mobile communication device 100, according to an embodiment of the present invention, comprising a casing 101, a display area 102 and means 104 for navigating among items (not shown) displayed in the display area. The display area 102 may comprise a status indication area 114 and one or more softkey bars 116. The status indication area 114 may for example include symbols for indicating battery status, reception quality, speaker on/off, present mode, time and date, etc. The status indication section is not in any way limited to include the symbols and the functions presented herein. The softkey bar 116 is operable using the navigation means 104 or, if using a touch sensitive screen, by tapping the softkey directly with a pen-like object, a finger, or other body part. The functions of the softkeys are not limited by the functions indicated in the figure. Neither are the placements of the softkey bar 116 and the status indication area 114 limited to be placed at the bottom and the top of the screen, as shown in the example. The navigation means 104 can be a set of buttons, a rotating input, a joystick, a touch pad, a multi-directional button, but can also be implemented using a touch sensitive display, wherein the displayed items directly can be tapped by a user for selection, or be voice activated via a headset or a built-in microphone. The mobile communication device 100 can also comprise other elements normally present in such a device, such as a keypad 106, a speaker 108, a microphone 110, a camera 112, a processor (not shown), a memory (not shown), one or more accelerometers (not shown), a vibration device (not shown), an AM/FM radio transmitter and receiver (not shown), a digital audio broadcast transmitter and receiver (not shown), etc.

Internal to the mobile terminal is a semiconductor assembly 10 (schematically shown with dotted lines and may be placed suitably anywhere inside the device 100), which may be anyone of the embodiments of semiconductor assemblies 10 shown in FIGS. 1-4, or other embodiments that may feature TSV:s, deep wells, TMV:s, or the like including relatively high heat conductive materials therein.

As used herein, the term "mobile terminal" may include, devices including but not limited to: a mobile signaling receiver or other appliance; a cellular radiotelephone with or without a multi-line display; a hand held phone; a Personal Communications System (PCS) terminal that may combine a cellular radiotelephone with data processing, facsimile and data communications capabilities; a PDA or Smartphone that can include a radiotelephone, pager, Internet/intranet access, Web browser, organizer, calendar and/or a global positioning system (GPS) receiver; a calculator; a handheld game or controller; a personal music playback system such as for CDs, minidisks, MP-3 files, memory sticks, or the like; a laptop computer; aeda Netbook—a tablet computer for example an iPad—and any handheld consumer electronics or portable device where small size is desired or necessary.

The embodiments of a semiconductor assembly 10 described herein may be used with conventional electronics. Moreover, it is understood that the overall construction of specific semiconductors and printed wiring boards is not critical. Accordingly, although exemplary embodiments are described in detail herein with respect to heat dissipation from thermally enhanced die stacks and printed assembly boards, detailed explanations of the construction and functioning of the integrated circuits and boards are deemed unnecessary for understanding by the skilled person.

Certain terminology is used herein for convenience only and is not to be taken as a limitation. For example, words such as "upside-down", "upper," "lower," "left," "right," "horizontal," "vertical," "upward," and "downward" merely describe the configuration shown in the figures. The components may be oriented in any direction and the terminology, therefore, should be understood as encompassing such variations unless specified otherwise.

1 printed wiring/circuit board (PWB)
2, 3 solder joint/balls
4 mold/capsule
10 semiconductor assembly
20 first package
200 second package
201 memory cube
21 die stack
210 DRAM dies in die stack
22 corner pad on package substrate
30 package substrate
31 stacked vias in package substrate acting like thermal connectors
32 electric connectors/micro bumps/copper (Cu) pillars
40 first/lower die
41 passive portion of lower die
42 active portion of lower die
50 at least one further/second/upper die
51 passive portion of upper die
52 active portion of upper die
60 heat spreader
61 heat spreader edges
62 heat spreader corner areas
70 thermal through-Silicon-Vias (TSV)
700 wide TSV
701 further TSV
71 first/upper/exposed TSV ends
72 second/lower TSV ends connected to lower die
73 deep well TSV
80 through-Mold-Vias (TMV)
90 stacked vias in PWB acting as thermal connections/conducts
100 ground layer of PWB

The invention claimed is:

1. A semiconductor assembly for operational connection to a printed wiring board (PWB) via electrical and thermal connections therebetween, the semiconductor assembly comprising:
   a package, which in turn comprises:
   at least one substrate,
   a first die stacked onto the substrate,
   at least one further die stacked onto the first die, wherein at least one heat spreader is positioned on an upper die of the at least one further die,
   at least one of the heat spreader in the package,
   TSVs extending through the stacked dies, such that ends of the TSVs are exposed at the further die, wherein the exposed ends of the TSVs are in thermal contact with the heat spreader, and
      wherein the at least one heat spreader positioned on the upper die is thermally connected to at least one TMV extending through the substrate down to the PWB, which TMV is thermally connected to the PWB for heat dissipation by means of the PWB acting as an additional heat spreader.

2. A semiconductor assembly according to claim 1, wherein the TMV is thermally connected through connectors to the PWB.

3. A semiconductor assembly according to claim 2, wherein the connectors to the PWB for heat dissipation from the heat spreader is thermally connected via the TMV at the edges of the heat spreader.

4. A semiconductor assembly according to claim 3, wherein the heat spreader at least covers all of the exposed TSV ends.

5. A semiconductor assembly according to claim 2, wherein the heat spreader at least covers all of the exposed TSV ends.

6. A semiconductor assembly according to claim 1, wherein the heat spreader at least covers all of the exposed TSV ends.

7. A semiconductor assembly according to claim 1, wherein the heat spreader at least covers all of the exposed TSV ends.

8. A semiconductor assembly according to claim 1, wherein the heat spreader covers substantially the whole area of the stacked dies.

9. A semiconductor assembly according to claim 8, wherein the heat spreader extends over substantially the whole area of the substrate.

10. A semiconductor assembly according to claim 9, wherein the substrate comprises thermal connectors connecting the TMVs to the PWB, which thermal substrate connectors are wider than electrical connections of the substrate.

11. A semiconductor assembly according to claim 9, wherein the at least one further die has its exposed ends of its TSVs in thermal contact with the heat spreader.

12. A semiconductor assembly according to claim 8, wherein the substrate comprises thermal connectors connecting the TMVs to the PWB, which thermal substrate connectors are wider than electrical connections of the substrate.

13. A semiconductor assembly according to claim 8, wherein the at least one further die has its exposed ends of its TSVs in thermal contact with the heat spreader.

14. A semiconductor assembly according to claim 13, wherein the at least one further die is the top most die in the package.

15. A semiconductor assembly according to claim 1, wherein the heat spreader has at least three corners.

16. A semiconductor assembly according to claim 1, wherein the substrate comprises thermal connectors connecting the TMVs to the PWB, which thermal substrate connectors are wider than electrical connections of the substrate.

17. A semiconductor assembly according to claim 16, wherein the at least one further die has its exposed ends of its TSVs in thermal contact with the heat spreader.

18. A semiconductor assembly according to claim 1, wherein the substrate comprises thermal connectors connecting the TMVs to the PWB, which thermal connectors are wider than electrical connections of the substrate.

19. A semiconductor assembly according to claim 1, wherein the at least one further die has its exposed ends of its TSVs in thermal contact with the heat spreader.

20. A semiconductor assembly according to claim 1, wherein the at least one further die has its exposed ends of its TSVs in thermal contact with the heat spreader.

21. A semiconductor assembly according to claim 1, wherein each TMV is linearly aligned with a corresponding connector of the substrate connected via solder joint to the PWB.

22. A semiconductor assembly according to claim 1, wherein each TMV is linearly aligned with a corresponding conduct of the PWB.

23. A semiconductor assembly according to claim 1, further comprising a capsule about the whole stacked dies, and wherein the TMV is arranged along the edges of the capsule.

24. A semiconductor assembly according to claim 1, wherein the heat spreader has at least three corners.

25. A semiconductor assembly according to claim 24, wherein connectors are through the substrate and down to the PWB for heat dissipation from the heat spreader and are thermally connected via the TMV at the areas of the corners of the heat spreader.

26. A semiconductor assembly according to claim 24, wherein the substrate comprises thermal connectors connecting the TMVs to the PWB, which thermal connectors are wider than electrical connections of the substrate.

* * * * *